(12) United States Patent  (10) Patent No.: US 8,299,824 B2
Motz et al.  (45) Date of Patent: Oct. 30, 2012

(54) SYSTEM PROVIDING A SWITCHED OUTPUT SIGNAL AND A HIGH RESOLUTION OUTPUT SIGNAL

(75) Inventors: Mario Motz, Wernberg (AT); Udo Ausserlechner, Villach (AT); Bernhard Schaffer, Villach (AT)

(73) Assignee: Infineon Technologies AG, Neubiberg (DE)

( * ) Notice: Subject to any disclaimer, the term of this patent is extended or adjusted under 35 U.S.C. 154(b) by 346 days.

(21) Appl. No.: 12/706,570

(22) Filed: Feb. 16, 2010

(65) Prior Publication Data

US 2011/0199132 A1  Aug. 18, 2011

(51) Int. Cl.
*H03K 17/00* (2006.01)
(52) U.S. Cl. ...................................... 327/124; 327/511
(58) Field of Classification Search .................. 327/124, 327/511
See application file for complete search history.

(56) References Cited

U.S. PATENT DOCUMENTS

| | | | |
|---|---|---|---|
| 4,408,155 A | 10/1983 | McBride | |
| 4,968,943 A | 11/1990 | Russo | |
| 5,218,298 A | 6/1993 | Vig | |
| 5,311,587 A | 5/1994 | Ohta et al. | |
| 6,242,891 B1 | 6/2001 | Parsonage | |
| 6,831,507 B2* | 12/2004 | Granville | 330/9 |
| 7,573,327 B1* | 8/2009 | Pertijs et al. | 330/9 |
| 7,663,442 B2* | 2/2010 | Wu et al. | 330/290 |
| 7,756,680 B2* | 7/2010 | Hammerschmidt | 702/185 |
| 7,834,685 B1* | 11/2010 | Pertijs | 330/9 |
| 7,990,740 B1* | 8/2011 | Notohamiprodjo et al. | 363/59 |

* cited by examiner

*Primary Examiner* — Lincoln Donovan
*Assistant Examiner* — William Hernandez
(74) *Attorney, Agent, or Firm* — Dicke, Billig & Czaja, PLLC (57) ABSTRACT

A system including a sensing system, a first chopped circuit, a second chopped circuit, and a clock generator. The sensing system is configured to provide sensed input signals. The first chopped circuit is configured to provide a switched output signal that switches in response to values of the sensed input signals crossing a limit. The second chopped circuit is configured to provide a high resolution output signal that corresponds to the sensed input signals and has a higher resolution than the switched output signal. The clock generator is configured to provide clock signals that synchronize chopping of the first chopped circuit and the second chopped circuit.

22 Claims, 8 Drawing Sheets

SYSTEM PROVIDING A SWITCHED OUTPUT SIGNAL AND A HIGH RESOLUTION OUTPUT SIGNAL

BACKGROUND

Sensors come in many shapes and sizes, from motion detectors that signal lights to go on when we enter a room to Geiger counters that detect radiation loss. Sensors are used in commercial, industrial, and personal applications including cars, machines, aerospace, medicine, manufacturing, and robotics. Often, sensors help regulate and control existing operations, such as proximity sensors that assist in aircraft and marine applications and speed and position sensors that assist in automotive engine management. Current sensors monitor AC and/or DC current for different electrical systems.

The resolution of a sensor is the smallest change it can detect in the quantity that it is measuring. Often in a digital display, the least significant digit will fluctuate, indicating that changes of that magnitude are only just resolved. The resolution is related to the precision with which the measurement is made. A sensor's sensitivity indicates how much the sensor's output changes when the measured quantity changes. Sensors that measure very small changes must have very high sensitivities. In addition, sensors need to have a small effect on what is measured.

Some applications use sensors that provide highly accurate measurement values and other applications use sensors to quickly detect a high overdrive (ODR) current. For example, a 100 ampere (A) current sensor might be needed to measure an offset error caused by a 10 milli-ampere (mA) standby-current. Also, an ODR current of 1000 A may need to be detected fast, such as on the order of 5 micro-seconds (u-seconds). Shunt resistors in the current path have been used to detect ODR current. However, shunt resistors can affect the accuracy of current measurements.

For these and other reasons there is a need for the present invention.

SUMMARY

One embodiment described in the disclosure provides a system including a sensing system, a first chopped circuit, a second chopped circuit, and a clock generator. The sensing system is configured to provide sensed input signals. The first chopped circuit is configured to provide a switched output signal that switches in response to values of the sensed input signals crossing a limit. The second chopped circuit is configured to provide a high resolution output signal that corresponds to the sensed input signals and has a higher resolution than the switched output signal. The clock generator is configured to provide clock signals that synchronize chopping of the first chopped circuit and the second chopped circuit.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In addition, while a particular feature or aspect of one embodiment may be disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements cooperate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

Figure 1:
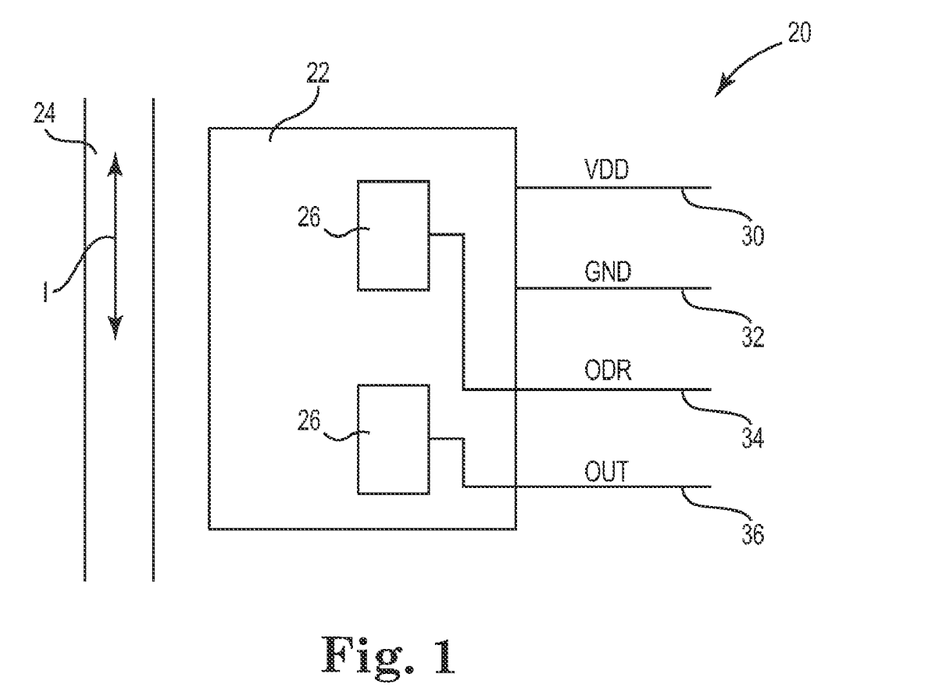
FIG. 1 is a diagram illustrating one embodiment of a system that includes a sensor that senses current in a conductor.

FIG. 1 is a diagram illustrating one embodiment of a system 20 that includes a sensor 22 that senses current (I) in a conductor 24. Sensor 22 includes a first circuit 26 that detects over-current conditions or ODR current in conductor 24 and a second circuit 28 that provides the value of the current in conductor 24. In one embodiment, system 20 is used in an automobile application. In one embodiment, system 20 is used in an electric car and/or hybrid electric car application. In other embodiments, system 20 is used in other suitable applications.

Sensor 22 senses the current in conductor 24 and maintains galvanic isolation between first circuit 26 and conductor 24 and between second circuit 28 and conductor 24. Sensor 22 receives power VDD at 30 and a reference, such as ground (GND), at 32. In one embodiment, sensor 22 magnetically senses the current in conductor 24. In one embodiment, sensor 22 senses the current in conductor 24 via at least one Hall sensor. In one embodiment, sensor 22 senses the current in conductor 24 via at least one spinning Hall sensor.

First circuit 26 switches in response to values of the sensed current crossing a reference limit and first circuit 26 provides a switched output signal ODR at 34. First circuit 26 switches in response to values of the sensed current crossing a reference limit that is a constant limit or a slope limit. Where, a slope limit provides earlier detection of ODR current and can be used to protect circuitry before arcing occurs at very high currents. In one embodiment, the reference limit is a constant limit of voltage, current, and/or magnetic field. In one embodiment, the reference limit is a constant limit of voltage, current, and/or magnetic field, such as a constant 500 A limit. In one embodiment, the reference limit is a slope limit of voltage, current, and/or magnetic field per time period. In one embodiment, the reference limit is a slope limit of voltage, current, and/or magnetic field per time period, such as 50 A per 10 u-seconds.

First circuit 26 is fast, where first circuit 26 switches in response to values of the sensed current crossing a reference limit and provides a valid switched output signal ODR at 34 in less than 5 u-seconds from the sensed current crossing the reference limit. First circuit 26 responds to the sensed current faster than second circuit 28, which is slower and provides a higher resolution output signal OUT at 36. In one embodiment, the response time of second circuit 28 is on the order of 50 u-seconds or more.

Second circuit 28 is more accurate than first circuit 26, where second circuit 28 obtains the value of the sensed current and provides the high resolution output signal OUT at 36. In one embodiment, second circuit 28 measures current in the 100 A range and provides resolution in the 10 mA or less range.

Sensor 22 is a monolithic integrated circuit chip that includes first circuit 26 and second circuit 28. In one embodiment, first circuit 26 is a chopped circuit. In one embodiment, second circuit 28 is a chopped circuit. In one embodiment, second circuit 28 is a non-chopped circuit. In one embodiment, first circuit 26 is a chopped circuit and second circuit 28 is a chopped circuit, where sensor 22 includes a clock generator that chops the input to the first circuit 26 and the input to the second circuit 28 at synchronized chopping frequencies, such as where one chopping frequency is an integer multiple of another chopping frequency. In one embodiment, first circuit 26 is a chopped circuit and second circuit 28 is a chopped circuit, where sensor 22 includes a clock generator that chops the input to the first circuit 26 and the input to the second circuit 28 at the same chopping frequency. In one embodiment, sensor 22 includes a bias circuit that provides temperature and technology spread compensation to the first circuit 26 and the second circuit 28.

Figure 2:
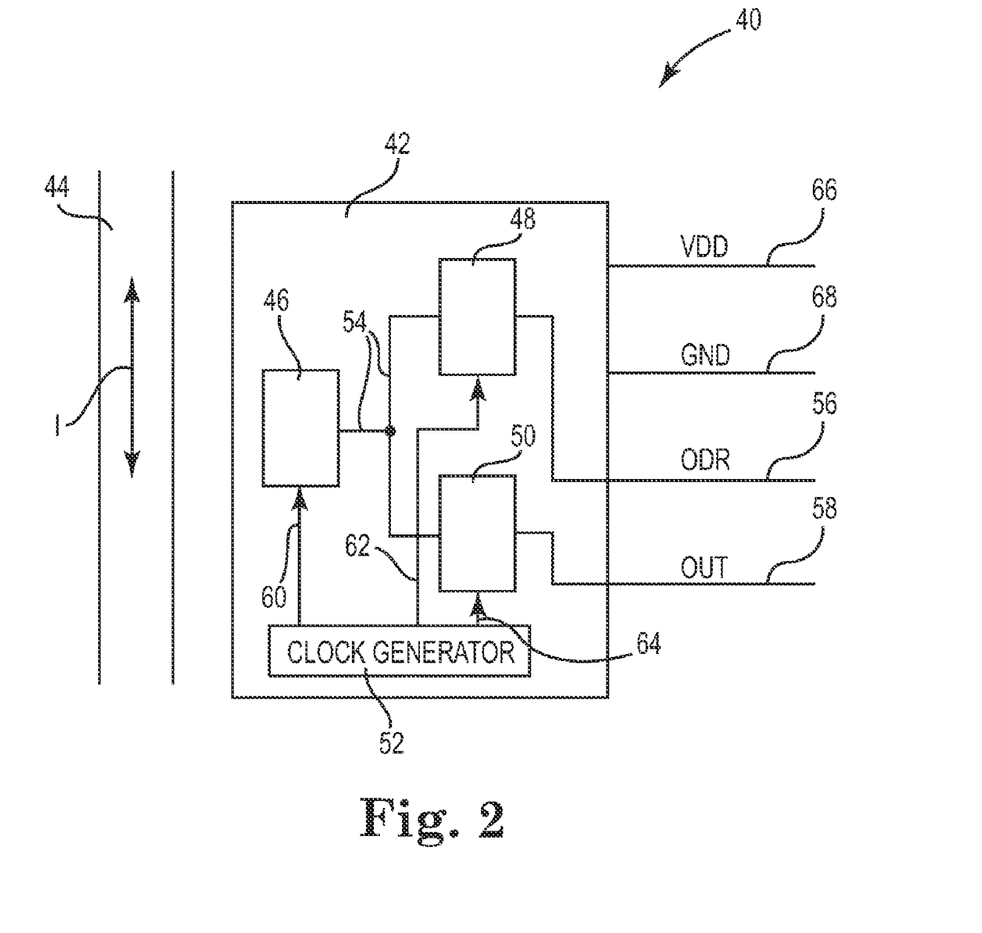
FIG. 2 is a diagram illustrating one embodiment of a system that includes a sensor that senses current in a conductor, detects ODR current in the conductor, and provides the value of the current in the conductor.

FIG. 2 is a diagram illustrating one embodiment of a system 40 that includes a sensor 42 that senses current (I) in conductor 44 via sensing system 46, detects ODR current in conductor 44 via a first chopped circuit 48, and provides the value of the current in conductor 44 via a second chopped circuit 50. System 40 is similar to system 20 and sensor 42 is similar to sensor 22. In one embodiment, system 40 is used in an automobile application. In one embodiment, system 40 is used in an electric car and/or hybrid electric car application. In other embodiments, system 40 is used in other suitable applications.

Sensor 42 senses the current in conductor 44 via sensing system 46 and maintains galvanic isolation between first chopped circuit 48 and conductor 44 and between second chopped circuit 50 and conductor 44. Sensor 42 includes sensing system 46, first chopped circuit 48, second chopped circuit 50, and clock generator 52. Sensing system 46 is electrically coupled to first chopped circuit 48 and second chopped circuit 50 via input signal path 54. First chopped circuit 48 receives input signals via input signal path 54 and provides switched output signal ODR at 56. Second chopped circuit 50 receives input signals via input signal path 54 and provides high resolution output signal OUT at 58. Clock generator 52 is electrically coupled to sensing system 46 via first clock path 60, to first chopped circuit 48 via second clock path 62, and to second chopped circuit 50 via third clock path 64. Sensor 42 receives power VDD at 66 and a reference, such as ground (GND), at 68.

Sensing system 46 senses the current in conductor 44 and provides input signals on input signal path 54. In one embodiment, sensing system 46 magnetically senses the current in conductor 44 to provide the input signals. In one embodiment, sensing system 46 senses the current in conductor 44 via at least one Hall sensor to provide the input signals. In one embodiment, sensing system 46 receives first clock signals from clock generator 52 via first clock path 60 and sensing system 46 senses the current in conductor 44 via a spinning Hall sensor that is clocked or spun via the first clock signals on first clock path 60.

First chopped circuit 48 receives the input signals from sensing system 46 via input signal path 54 and second clock signals from clock generator 52 via second clock path 62. First chopped circuit 48 chops the input signals via the second clock signals and switches in response to values of the input signals crossing a reference limit. In one embodiment, the reference limit is a constant limit of voltage, current, and/or magnetic field. In one embodiment, the reference limit is a constant limit of voltage, current, and/or magnetic field, such as a constant 500 A limit. In one embodiment, the reference limit is a slope limit of voltage, current, and/or magnetic field per time period. In one embodiment, the reference limit is a slope limit of voltage, current, and/or magnetic field per time period, such as 50 A per 10 u-seconds.

First chopped circuit 48 provides switched output signal ODR at 56. In one embodiment, first chopped circuit 48 is a chopped auto-zeroing comparator, where chopping and auto-zeroing is synchronized via the second clock signals on second clock path 62. In one embodiment, first chopped circuit 48 is a chopped auto-zeroing comparator that is chopped and auto-zeroed at the same frequency via the second clock signals on second clock path 62. In one embodiment, first chopped circuit 48 includes at least two chopped auto-zeroing comparators and at least one of the at least two auto-zeroing comparators provides a valid switched output signal during each chopping phase.

Second chopped circuit 50 receives the input signals from sensing system 46 via input signal path 54 and third clock signals from clock generator 52 via third clock path 64. Second chopped circuit 50 chops the input signals via the third clock signals and obtains the value of the input signals. Second chopped circuit 50 provides the high resolution output signal OUT at 58, which corresponds to the sensed input signals. In one embodiment, clock generator 52 synchronizes clocking or chopping of the first chopped circuit 48 and the second chopped circuit 50. In one embodiment, clock generator 52 clocks or chops first chopped circuit 48 and second chopped circuit 50 at the same frequency. In one embodiment, second chopped circuit 50 is a chopped sigma delta analog to digital converter. In one embodiment, second chopped circuit 50 is a chopped analog comparator. In one embodiment, second chopped circuit 50 is a chopped auto-zeroed analog comparator. In one embodiment, second chopped circuit 50 is a chopped analog amplifier. In one embodiment, second chopped circuit 50 is another suitable analog to digital converter. In other embodiments, second chopped circuit 50 can be a non-chopped circuit, such as an auto-zeroed analog comparator or an analog amplifier or an auto-zeroed analog to digital converter.

First chopped circuit 48 is fast, where first chopped circuit 48 switches in response to values of the input signals crossing the reference limit and provides a valid switched output signal ODR at 56 in 5 u-seconds or less, from the input signals crossing the reference limit. First chopped circuit 48 responds to the input signals faster than second chopped circuit 50, which is slower for providing the higher resolution output signal OUT at 58. Second chopped circuit 50 is more accurate than first chopped circuit 48, where second chopped circuit 50 obtains the value of the input signals and provides the high resolution output signal OUT at 58. In one embodiment, the response time of second chopped circuit 50 is on the order of 50 u-seconds or more. In one embodiment, first chopped circuit 48 provides a zero or one switched output signal and second chopped circuit 50 measures current in the 100 A range and provides resolution in the 10 mA or less range.

Sensor 42 is a monolithic integrated circuit chip that includes sensing system 46, first chopped circuit 48, second chopped circuit 50, and clock generator 52. In one embodiment, sensor 42 includes a bias circuit that provides temperature and technology spread compensation to the first chopped circuit 48 and the second chopped circuit 50.

Figure 3:
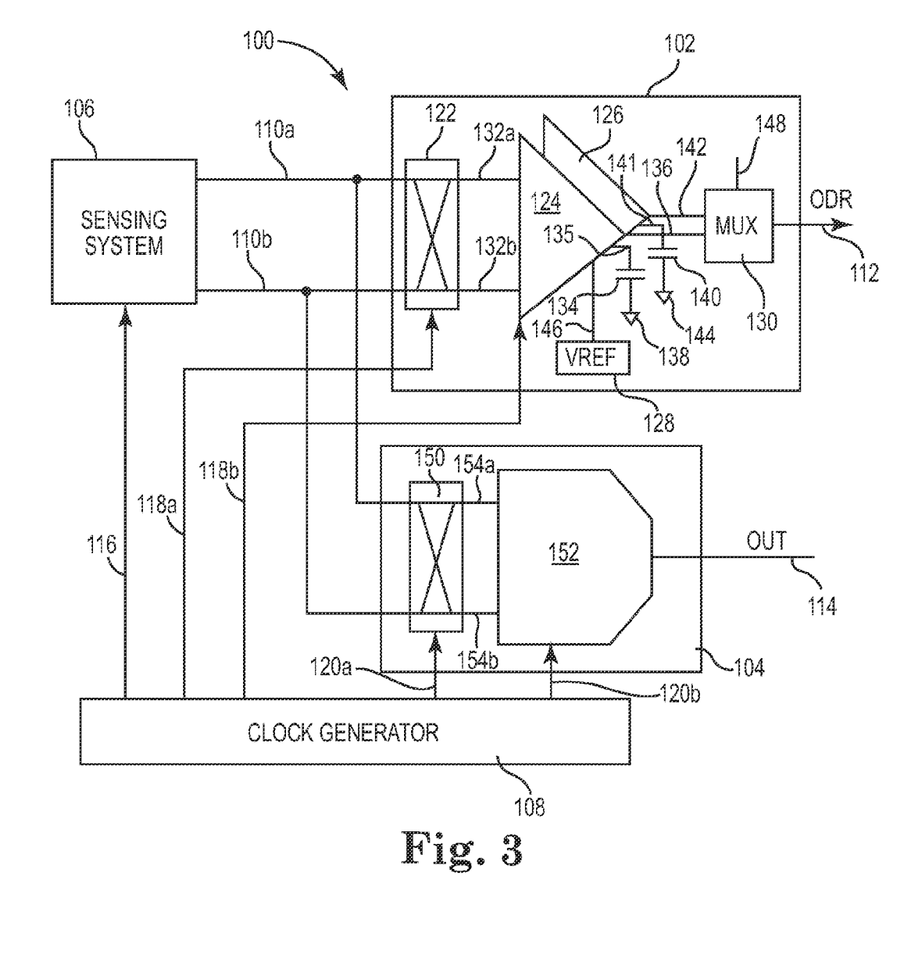
FIG. 3 is a diagram illustrating one embodiment of a sensor that includes a first chopped circuit for detecting ODR current and a second chopped circuit for measuring the value of the current.

FIG. 3 is a diagram illustrating one embodiment of a sensor 100 that includes a first chopped circuit 102 for detecting ODR current and a second chopped circuit 104 for measuring the value of the current. Sensor 100 is similar to sensor 22 (shown in FIG. 1) and sensor 42 (shown in FIG. 2).

Sensor 100 includes sensing system 106, first chopped circuit 102, second chopped circuit 104, and clock generator 108. Sensing system 106 is electrically coupled to first chopped circuit 102 and second chopped circuit 104 via input signal paths 110a and 110b. First chopped circuit 102 receives input signals via input signal paths 110a and 110b and provides switched output signal ODR at 112. Second chopped circuit 104 receives input signals via input signal paths 110a and 110b and provides high resolution output signal OUT at 114. Clock generator 108 is electrically coupled to sensing system 106 via first clock path 116, to first chopped circuit 102 via second clock path 118a and 118b, and to second chopped circuit 104 via third clock path 120a and 120b.

First chopped circuit 102 includes a first demodulator (or chopper) 122, a first auto-zeroing comparator 124, a second auto-zeroing comparator 126, a reference 128, and a multiplexer 130. First chopped circuit 102 includes a first chopped auto-zeroing comparator provided via the first demodulator (or chopper) 122 and first auto-zeroing comparator 124 and a second chopped auto-zeroing comparator provided via the first demodulator (or chopper) 122 and second auto-zeroing comparator 126. Sensing system 106 is electrically coupled to first demodulator 122 via input signal paths 110a and 110b and first demodulator 122 is electrically coupled to first auto-zeroing comparator 124 and second auto-zeroing comparator 126 via comparator input paths 132a and 132b. The output of first auto-zeroing comparator 124 is electrically coupled to an input of multiplexer 130 via first comparator output path 136. An internal node of first auto-zeroing comparator 124 is electrically coupled to a first auto-zero capacitor 134 via capacitor path 135. The other side of the first auto-zero capacitor 134 is electrically coupled to a reference, such as ground, at 138. The output of second auto-zeroing comparator 126 is electrically coupled to another input of multiplexer 130 via second comparator output path 142. An internal node of second auto-zeroing comparator 126 is electrically coupled to a second auto-zero capacitor 140 via capacitor path 141. The other side of the second auto-zero capacitor 140 is electrically coupled to a reference, such as ground, at 144. In one embodiment, first chopped circuit 102 includes more then two chopped auto-zeroing comparators. In other embodiments, first chopped circuit 102 includes another suitable number of chopped auto-zeroing comparators, such as four or eight chopped auto-zeroing comparators.

The reference 128 is electrically coupled to first auto-zeroing comparator 124 and to second auto-zeroing comparator 126 via reference path 146. Reference 128 provides a reference voltage VREF at 128 to first auto-zeroing comparator 124 and to second auto-zeroing comparator 126 via reference path 146. Multiplexer 130 is controlled via a select input at 148 to switch the multiplexer output between the output of first auto-zeroing comparator 124 and the output of second auto-zeroing comparator 126 to provide the switched output signal ODR at 112. Clock generator 108 is electrically coupled to first demodulator 122 via second clock path 118a and to first and second auto-zeroing comparators 124 and 126 via second clock path 118b. In one embodiment, reference 128 includes a programmable digital to analog converter that provides a programmable reference voltage to first auto-zeroing comparator 124 and to second auto-zeroing comparator 126 via reference path 146.

Second chopped circuit 104 includes a second demodulator (or chopper) 150 and a measurement circuit 152. Sensing system 106 is electrically coupled to second demodulator 150 via input signal paths 110a and 110b and second demodulator 150 is electrically coupled to measurement circuit 152 via input paths 154a and 154b. The output of measurement circuit 152 provides high resolution output signal OUT at 114. Clock generator 108 is electrically coupled to second demodulator 150 via third clock path 120a and to measurement circuit 152 via third clock path 120b. In one embodiment, measurement circuit 152 is a continuous-time, sigma delta-analog to digital converter (SD-ADC) and second chopped circuit 104 is a chopped SD-ADC circuit. In one embodiment, measurement circuit 152 is an analog comparator and second chopped circuit 104 is a chopped analog comparator. In one embodiment, measurement circuit 152 is an auto-zeroed analog comparator and second chopped circuit 104 is a chopped auto-zeroed analog comparator. In one embodiment, measurement circuit 152 is an analog amplifier and second chopped circuit 104 is a chopped analog amplifier.

Sensing system 106 is a magnetic sensing system that senses a magnetic field and provides sensed input signals on input signal paths 110a and 110b. In one embodiment, sensing system 106 receives a first clock signal from clock generator 108 via first clock path 116 and sensing system 106 senses a magnetic field via a spinning Hall sensor that is clocked or spun via the first clock signal on first clock path 116. In one embodiment, sensing system 106 senses the magnetic field created by a current in a conductor. In one embodiment, sensing system 106 senses the magnetic field created by a current in a conductor and sensing system 106 maintains galvanic isolation between the first chopped circuit 102 and the conductor and between the second chopped circuit 104 and the conductor.

First demodulator 122 receives the input signals from sensing system 106 via input signal paths 110a and 110b and a clock signal from clock generator 108 via second clock path 118a. First demodulator 122 chops the input signals via the clock signal on second clock path 118a and provides the chopped input signals to auto-zeroing comparators 124 and 126 via comparator input paths 132a and 132b. Auto-zeroing comparators 124 and 126 receive a clock signal from clock generator 108 via second clock path 118b and auto-zeroing comparators 124 and 126 are auto-zeroed using the auto-zeroing capacitors 134 and 140 and the clock signal on second clock path 118b. After auto-zeroing, auto-zeroing comparators 124 and 126 compare values of the chopped input signals to a reference limit, such as voltage reference VREF at 128, and provide a switched output signal to multiplexer 130. Select input 148 is controlled to provide a valid switched output signal ODR at 112, where at least one of the outputs from auto-zeroing comparators 124 and 126 is valid during each phase of the chopping and auto-zeroing process. In one embodiment, chopping and auto-zeroing in first chopped circuit 102 is synchronized via the clock signals on second clock paths 118a and 118b. In one embodiment, first chopped circuit 102 is chopped and auto-zeroed at the same frequency via the clock signals on second clock paths 118a and 118b. In one embodiment, auto-zeroing comparators 124 and 126 are configured to switch in response to a constant reference limit of voltage, current, and/or magnetic field. In one embodiment, auto-zeroing comparators 124 and 126 are configured to switch in response to a slope reference limit of voltage, current, and/or magnetic field per time period. In one four phase embodiment, in the first phase, auto-zeroing comparator 124 stores an input signal that is equal to the measured signal Vsignal plus an offset Voffset. In the second phase, auto-zeroing comparator 124 stores an input signal that is equal to the measured signal Vsignal minus the offset Voffset (or the offset Voffset minus the measured signal Vsignal). In the third phase and the fourth phase, the difference (or sum) of the values stored in the first phase and the second phase is built and the resulting offset Voffset is added to the reference voltage VREF at 128. The sum of the reference voltage VREF and the offset Voffset is compared to the input signals of Vsignal plus Voffset during the third and fourth phases to provide a valid comparison result that is a valid switched output signal during the third and fourth phases. This is a fast and continuous output signal during the third and fourth phases.

In this four phase embodiment, auto-zeroing comparator 126 operates similar to auto-zeroing comparator 124, except auto-zeroing comparator 126 provides valid switched output signals during the first and second phases. In the third phase, auto-zeroing comparator 124 stores an input signal that is equal to the measured signal Vsignal minus the offset Voffset (or the offset Voffset minus the measured signal Vsignal). In the fourth phase, auto-zeroing comparator 126 stores an input signal that is equal to the measured signal Vsignal plus an offset Voffset. In the first and second phases, the difference (or sum) of the values stored in the third phase and the fourth phase is built and the resulting offset Voffset is added to the reference voltage VREF at 128. The sum of the reference voltage VREF and the offset Voffset is compared to the input signals of Vsignal plus Voffset during the first and second phases to provide a valid comparison result that is a valid switched output signal during the first and second phases. This is a fast and continuous output signal during the first and second phases.

Also, in this four phase embodiment, select input 148 is controlled to provide a valid switched output signal ODR at 112, where valid switched output signals from auto-zeroing comparator 126 are provided during the first and second phases and valid switched output signals from auto-zeroing comparator 124 are provided during the third and fourth phases. In one embodiment of the four phase embodiment, chopping and auto-zeroing in first chopped circuit 102 is synchronized via the clock signals on second clock paths 118a and 118b. In one embodiment of the four phase embodiment, first chopped circuit 102 is chopped and auto-zeroed at the same frequency via the clock signals on second clock paths 118a and 118b.

In one embodiment, each of the auto-zeroing comparators 124 and 126 stores reference voltage VREF plus offset voltages Voffset plus measured signal voltage Vsignal on capacitors in the storing phase(s), to compare it with newly measured values of measured signal voltage Vsignal_new plus offset voltages Voffset. In the comparing phase(s), each of the auto-zeroing comparators 124 and 126 compares the stored reference voltage VREF plus offset voltages Voffset plus measured signal voltage Vsignal to newly measured signal values of the reference voltage VREF plus offset voltages Voffset plus new measured signal voltage Vsignal_new. The slope of the measured signal, which is the change of the measured signal, Vsignal_new minus Vsignal, divided by the change in time, is compared to a slope limit to provide a valid comparison result that is a valid switched output signal. Here, the reference voltage VREF can be applied in either the storing phase(s) or the comparing phase(s).

Second demodulator 150 receives the input signals from sensing system 106 via input signal paths 110a and 110b and a clock signal from clock generator 108 via third clock path 120a. Second demodulator 150 chops the input signals via the clock signal on third clock path 120a and provides the chopped input signals to measurement circuit 152 via input paths 154a and 154b. Measurement circuit 152 receives a clock signal from clock generator 108 via third clock path 120b and obtains the value of the input signals. Measurement circuit 152 provides the high resolution output signal OUT at 58, which corresponds to the received input signals. In one embodiment, measurement circuit 152 is a continuous-time, SD-ADC and second chopped circuit 104 is a chopped SD-ADC circuit. In one embodiment, measurement circuit 152 is an analog comparator and second chopped circuit 104 is a chopped analog comparator. In one embodiment, measurement circuit 152 is an auto-zeroed analog comparator and second chopped circuit 104 is a chopped auto-zeroed analog comparator. In one embodiment, measurement circuit 152 is an analog amplifier and second chopped circuit 104 is a chopped analog amplifier.

Clock generator 108 provides clock signals that synchronize sensing system 106, chopping in the first chopped circuit 102, auto-zeroing in the first chopped circuit 102, chopping in the second chopped circuit 104, and obtaining the measurement in the second chopped circuit 104. In one embodiment, chopping of the first chopped circuit 102 and the second chopped circuit 104 is synchronized via the clock signals on second clock paths 118a and 118b and third clock paths 120a and 120b. In one embodiment, first chopped circuit 102 and second chopped circuit 104 are chopped at the same frequency via the clock signals on second clock paths 118a and 118b and third clock paths 120a and 120b. In one embodiment, chopping and auto-zeroing in first chopped circuit 102 is synchronized via the clock signals on second clock paths 118a and 118b and chopping of the first chopped circuit 102 and the second chopped circuit 104 is synchronized via the clock signals on second clock paths 118a and 118b and third clock paths 120a and 120b. In one embodiment, first chopped circuit 102 is chopped and auto-zeroed at the same frequency via the clock signals on second clock paths 118a and 118b and first chopped circuit 102 and second chopped circuit 104 are chopped at the same frequency via the clock signals on second clock paths 118a and 118b and third clock paths 120a and 120b. In one embodiment, chopping of first chopped circuit 102 and second chopped circuit 104 is synchronized via the clock signals on second clock paths 118a and 118b and third clock paths 120a and 120b and sensing system 106 includes a spinning Hall sensor, where spinning of the spinning Hall sensor is synchronized with chopping of the first chopped circuit 102 and the second chopped circuit 104. In one embodiment, first chopped circuit 102 and second chopped circuit 104 are chopped at the same frequency via the clock signals on second clock paths 118a and 118b and third clock paths 120a and 120b and sensing system 106 includes a spinning Hall sensor that is spun at the same frequency as the chopping frequency of the first chopped circuit 102 and the second chopped circuit 104. In one embodiment, chopping and auto-zeroing of first chopped circuit 102 is synchronized via the clock signals on second clock paths 118a and 118b, and chopping of first chopped circuit 102 and second chopped circuit 104 is synchronized via the clock signals on second clock paths 118a and 118b and third clock paths 120a and 120b, and sensing system 106 includes a spinning Hall sensor, where spinning of the spinning Hall sensor is synchronized with chopping of the first chopped circuit 102 and the second chopped circuit 104. In one embodiment, first chopped circuit 102 is chopped and auto-zeroed at the same frequency via the clock signals on second clock paths 118a and 118b, and first chopped circuit 102 and second chopped circuit 104 are chopped at the same frequency via the clock signals on second clock paths 118a and 118b and third clock paths 120a and 120b, and sensing system 106 includes a spinning Hall sensor that is spun at the same frequency as the chopping frequency of the first chopped circuit 102 and the second chopped circuit 104.

First chopped circuit 102 provides fast, continuous, valid output signals ODR at 112 during each phase of the chopping and/or spin phases. The auto-zeroing comparators 124 and 126 switch in response to values of the input signals crossing the reference voltage limit VREF at 128 and first chopped circuit 102 provides a valid switched output signal ODR at 112 in less than 5 u-seconds, from the input signals crossing the reference voltage limit VREF at 128. First chopped circuit 102 responds to the input signals faster than second chopped circuit 104, which is slower for providing the higher resolution output signal OUT at 114. In one embodiment, the response time of second chopped circuit 104 is on the order of 50 u-seconds or more. In one embodiment, first chopped circuit 102 provides a zero or one output signal and second chopped circuit 104 measures current in the 100 A range and provides resolution in the 10 mA or less range.

Sensor 100 is a monolithic integrated circuit chip that includes sensing system 106, first chopped circuit 102, second chopped circuit 104, and clock generator 108. In one embodiment, sensor 100 includes a bias circuit that provides temperature and technology spread compensation to the first chopped circuit 102 and the second chopped circuit 104.

Figure 4:
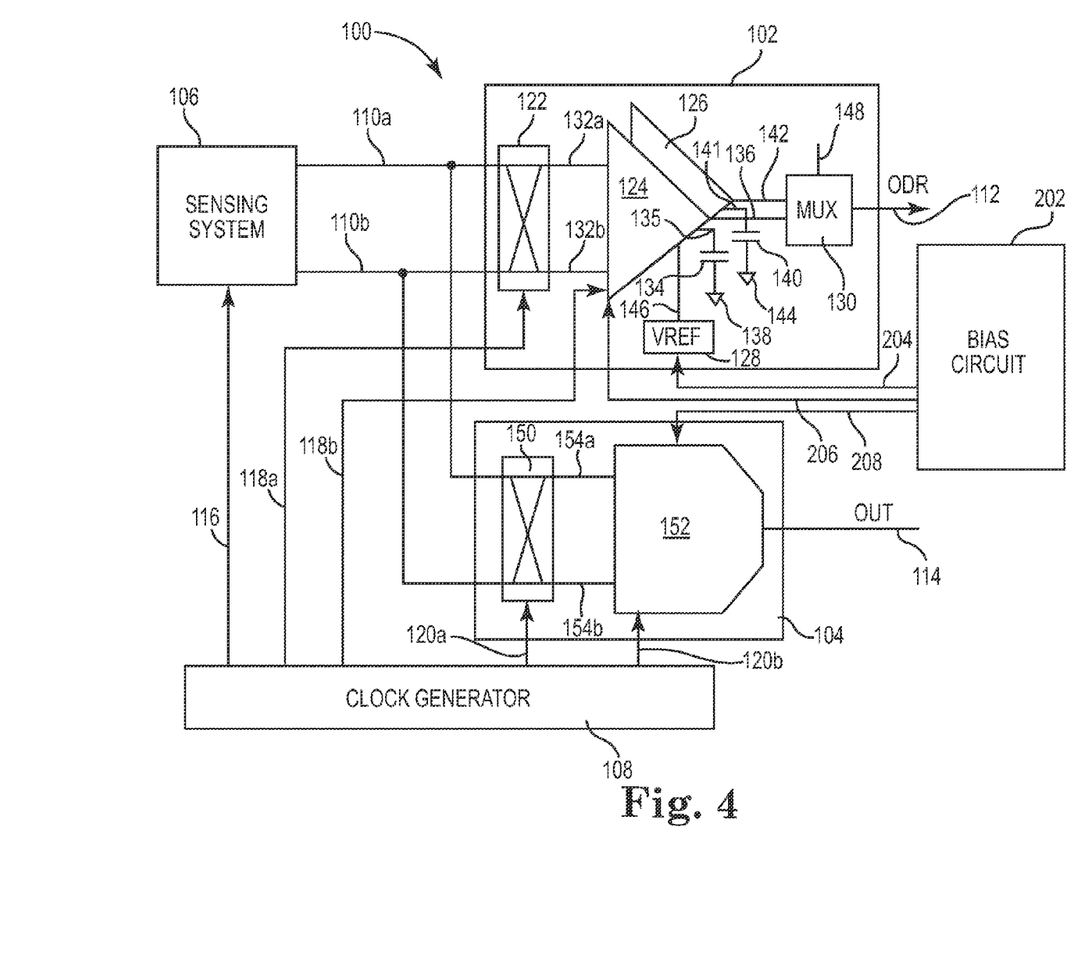
FIG. 4 is a diagram of one embodiment of a sensor that includes a bias circuit.

FIG. 4 is a diagram of one embodiment of a sensor 200 that includes a bias circuit 202. Sensor 200 is the same as sensor 100, where like numerals represent like components, with the exception that sensor 200 includes bias circuit 202.

Bias circuit 202 is electrically coupled to first chopped circuit 102 via first bias path 204 and second bias path 206 and to second chopped circuit 104 via third bias path 208. Bias circuit 202 is electrically coupled to reference 128 via first bias path 204 and to auto-zeroing comparators 124 and 126 via second bias path 206. Bias circuit 202 is electrically coupled to measurement circuit 152 via third bias path 208.

Bias circuit 202 is a temperature and technology spread compensation circuit. In one embodiment, bias circuit 202 provides analog bias current. In one embodiment, bias circuit 202 provides operating currents for SD-ADC circuits and/or auto-zeroing comparators.

FIGS. 5A-5D are diagrams illustrating one embodiment of a first chopped auto-zeroing comparator 300 coupled to a spinning Hall plate sensing system 302 in a four phase process. FIGS. 6A-6D are diagrams illustrating one embodiment of a second chopped auto-zeroing comparator 400 coupled to the same spinning Hall plate sensing system 302 in the four phase process. The first chopped auto-zeroing comparator 300 provides valid output signals during the third and fourth phases of the four phase process and the second chopped auto-zeroing comparator 400 provides valid output signals during the first and second phases of the four phase process.

Figures 5A, 5B:
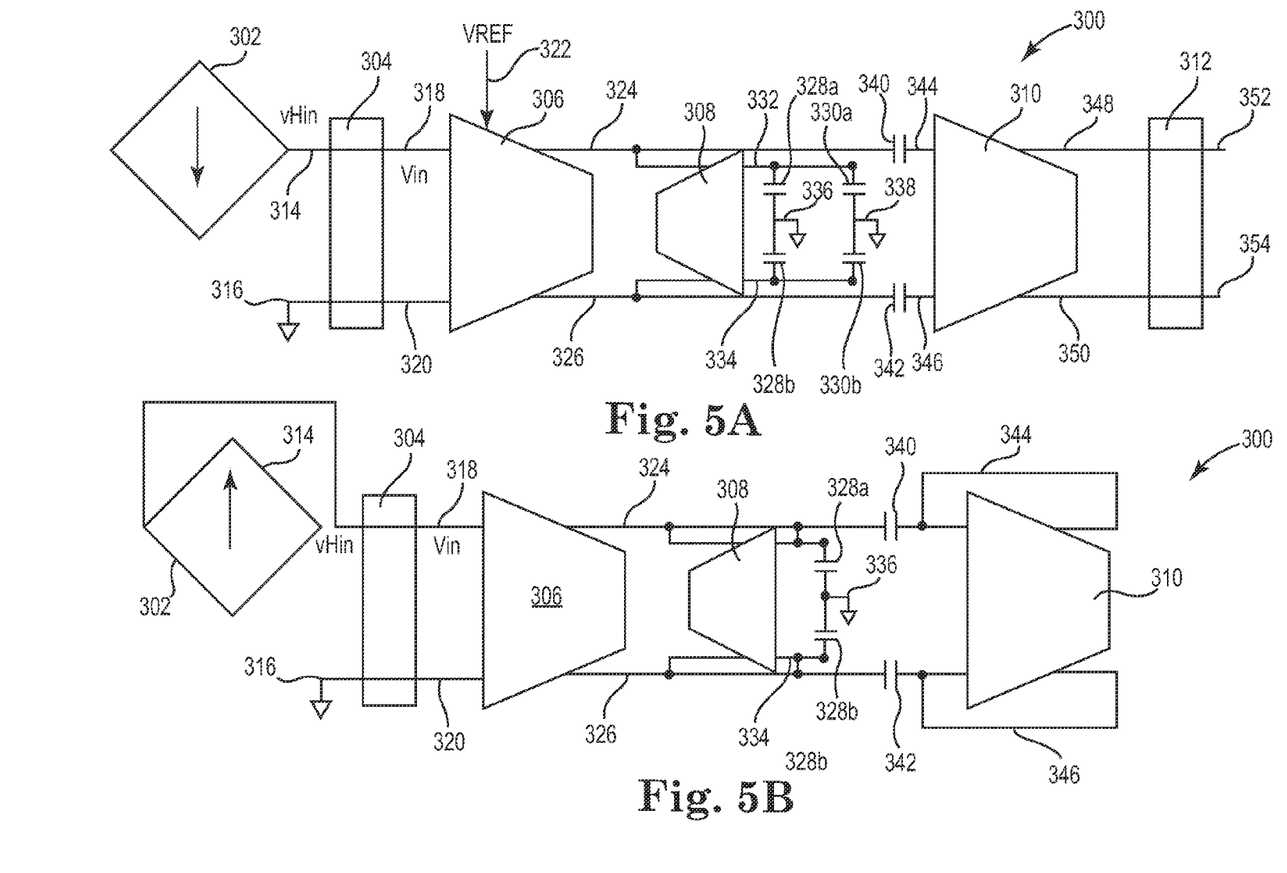
FIG. 5A is a diagram illustrating a first chopped auto-zeroing comparator and spinning Hall plate sensing system in the fourth phase of a four phase process.
FIG. 5B is a diagram illustrating the first chopped auto-zeroing comparator and spinning Hall plate sensing system in the first phase of the four phase process.

FIG. 5A is a diagram illustrating first chopped auto-zeroing comparator 300 and spinning Hall plate sensing system 302 in the fourth phase of the four phase process, where the arrow in the spinning Hall plate sensing system 302 is directed downward. First chopped auto-zeroing comparator 300 includes a first demodulator (or chopper) 304, an input stage 306, an offset amplifier 308, an output stage 310, and a second demodulator (chopper) 312. One input of first demodulator 304 is electrically coupled to the right side of spinning Hall plate sensing system 302 via first input path 314 and another input of first demodulator 304 is electrically coupled to a reference, such as ground, via second input path 316. First demodulator 304 is electrically coupled to input stage 306 via first input stage path 318 and second input stage path 320.

First demodulator 304 receives input signal VHin from the right side of spinning Hall plate sensing system 302, where input signal VHin includes the Hall plate signal VHsignal plus the Hall plate offset voltage VHoffset. Input stage 306 receives input signal VHin and adds an amplifier offset voltage VAoffset to obtain input signal Vin, where input signal Vin is equal to VHsignal+VHoffset+VAoffset.

Input stage 306 receives reference voltage Vref at 322 and is electrically coupled to offset amplifier 308 via first stage output paths 324 and 326. First auto-zeroing storage capacitor 328a and second auto-zeroing storage capacitor 330a are electrically coupled to offset amplifier 308 via amplifier input path 332. First auto-zeroing storage capacitor 328b and second auto-zeroing storage capacitor 330b are electrically coupled to offset amplifier via amplifier input path 334. The other sides of first auto-zeroing storage capacitors 328a and 328b are electrically coupled to a reference, such as ground, at 336, and the other sides of second auto-zeroing storage capacitors 330a and 330b are electrically coupled to a reference, such as ground, at 338.

From previous phases, VHoffset+VAoffset is stored on first and second auto-zeroing storage capacitors 328a, 328b, 330a, and 330b. Input stage 306 receives reference voltage Vref at 322 and adds the stored offset voltages VHoffset+VAoffset to reference voltage Vref. Input stage 306 receives Vin, which is Vsignal+VHoffset+VAoffset, and compares the received Vsignal+VHoffset+VAoffset to the built Vref+VHoffset+VAoffset, i.e., input stage 306 compares Vsignal to Vref.

Input stage 306 is electrically coupled to first decoupling capacitor 340 via first stage output path 324 and to second decoupling capacitor 342 via first stage output path 326. The other side of first decoupling capacitor 340 is electrically coupled to output stage 310 via output stage input path 344 and the other side of second decoupling capacitor 342 is electrically coupled to output stage 310 via output stage input path 346.

Input stage 306 provides the comparison result, which is received by output stage 310 via first and second decoupling capacitors 340 and 342. Output stage 310 is electrically coupled to second demodulator 312 via output stage output paths 348 and 350. Second demodulator 312 receives valid comparison results from output stage 310 and second demodulator 312 provides the comparison results at outputs 352 and 354.

FIG. 5B is a diagram illustrating first chopped auto-zeroing comparator 300 and spinning Hall plate sensing system 302 in the first phase of the four phase process, where the arrow in the spinning Hall plate sensing system 302 is directed upward. One input of first demodulator 304 is electrically coupled to the left side of spinning Hall plate sensing system 302 via first input path 314 and the other input of first demodulator 304 is electrically coupled to the reference via second input path 316. First demodulator 304 is electrically coupled to input stage 306 via first input stage path 318 and second input stage path 320.

Input stage 306 is electrically coupled to offset amplifier 308 via first stage output paths 324 and 326. Input stage 306 is electrically coupled to an output and an input of offset amplifier 308 and to one side of first auto-zeroing storage capacitor 328a via first stage output path 324. Input stage 306 is electrically coupled to another output and another input of offset amplifier 308 and to one side of first auto-zeroing storage capacitor 328b via first stage output path 326. The other sides of first auto-zeroing storage capacitors 328a and 328b are electrically coupled to the reference at 336.

First demodulator 304 receives input signal VHin from the left side of spinning Hall plate sensing system 302, where input signal VHin includes the Hall plate signal VHsignal plus the Hall plate offset voltage VHoffset. Input stage 306 receives input signal VHin and adds amplifier offset voltage VAoffset to obtain input signal Vin, where input signal Vin is equal to VHsignal+VHoffset+VAoffset. Offset amplifier 308 stores Vin, which is VHsignal+VHoffset+VAoffset, on first auto-zeroing capacitors 328a and 328b.

Input stage 306 is electrically coupled to first decoupling capacitor 340 via first stage output path 324 and to second decoupling capacitor 342 via first stage output path 326. The other side of first decoupling capacitor 340 is electrically coupled to output stage 310 via output stage input path 344 and the other side of second decoupling capacitor 342 is electrically coupled to output stage 310 via output stage input path 346.

The outputs of output stage 310 are electrically coupled back to the inputs of output stage 310 via output stage paths 344 and 346.

Figure 5C:
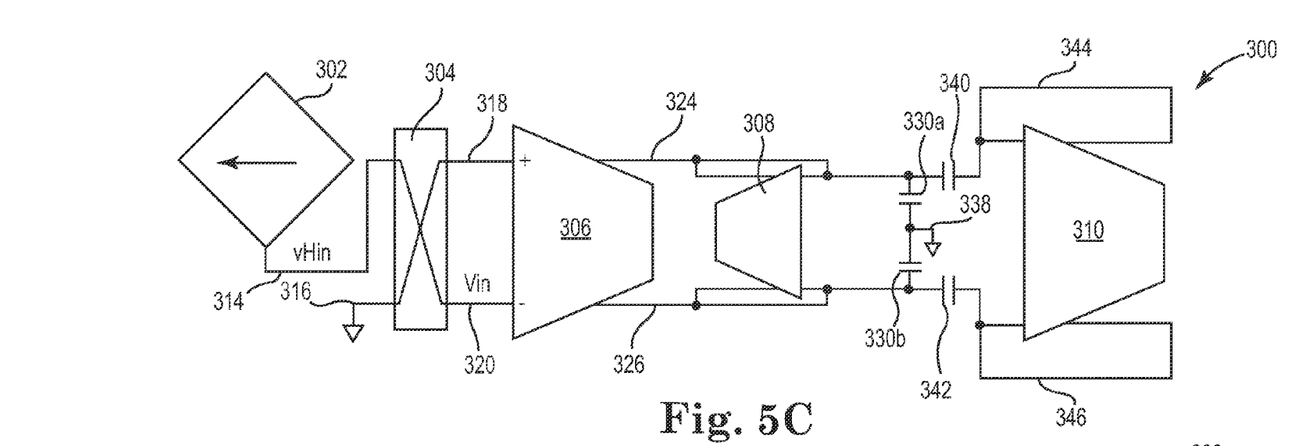
FIG. 5C is a diagram illustrating the first chopped auto-zeroing comparator and spinning Hall plate sensing system in the second phase of the four phase process.

FIG. 5C is a diagram illustrating first chopped auto-zeroing comparator 300 and spinning Hall plate sensing system 302 in the second phase of the four phase process, where the arrow in the spinning Hall plate sensing system 302 is directed towards the left. One input of first demodulator 304 is electrically coupled to the bottom of spinning Hall plate sensing system 302 via first input path 314 and the other input of first demodulator 304 is electrically coupled to the reference via second input path 316. First demodulator 304 is electrically coupled to input stage 306 via first input stage path 318 and second input stage path 320.

Input stage 306 is electrically coupled to offset amplifier 308 via first stage output paths 324 and 326. Input stage 306 is electrically coupled to an output and an input of offset amplifier 308 and to one side of second auto-zeroing storage capacitor 330a via first stage output path 324. Input stage 306 is electrically coupled to another output and another input of offset amplifier 308 and to one side of second auto-zeroing storage capacitor 330b via first stage output path 326. The other sides of second auto-zeroing storage capacitors 330a and 330b are electrically coupled to the reference at 338.

First demodulator 304 receives input signal VHin from the bottom of spinning Hall plate sensing system 302, where input signal VHin includes the Hall plate signal VHsignal minus the Hall plate offset voltage VHoffset. First demodulator 304 crosses the input signals to provide the input signal at 314 to second input stage path 320 and to provide the input signal at 316 to first input stage path 318. Input stage 306 receives input signal VHin and subtracts amplifier offset voltage VAoffset to obtain input signal Vin, where input signal Vin is equal to VHsignal−VHoffset−VAoffset. Offset amplifier 308 stores—VHsignal+VHoffset+VAoffset on second auto-zeroing capacitors 330a and 330b.

Input stage 306 is electrically coupled to first decoupling capacitor 340 via first stage output path 324 and to second decoupling capacitor 342 via first stage output path 326. The other side of first decoupling capacitor 340 is electrically coupled to output stage 310 via output stage input path 344 and the other side of second decoupling capacitor 342 is electrically coupled to output stage 310 via output stage input path 346.

The outputs of output stage 310 are electrically coupled back to the inputs of output stage 310 via output stage input paths 344 and 346.

Figure 5D:
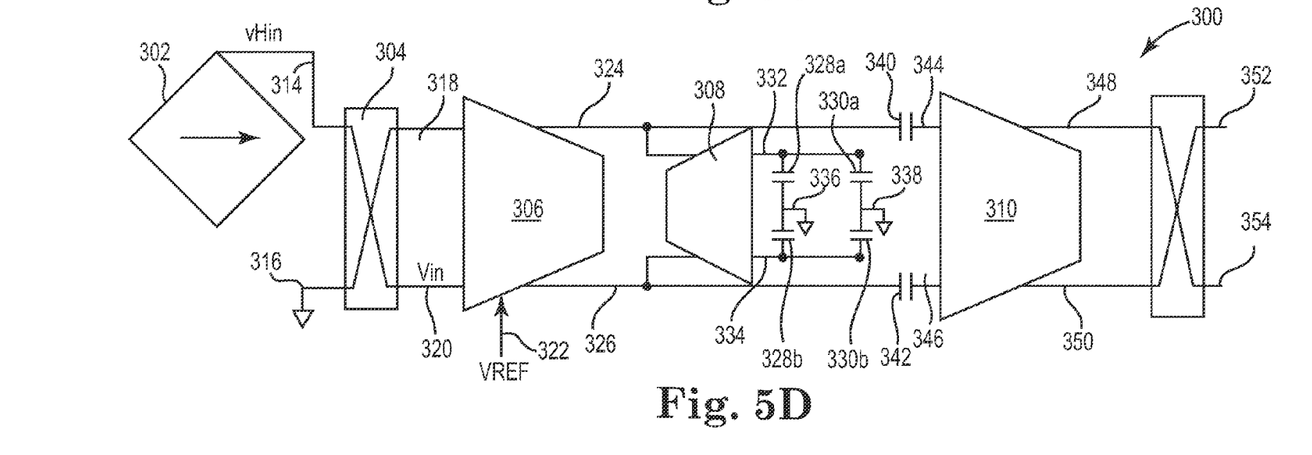
FIG. 5D is a diagram illustrating the first chopped auto-zeroing comparator and spinning Hall plate sensing system in the third phase of the four phase process.

FIG. 5D is a diagram illustrating first chopped auto-zeroing comparator 300 and spinning Hall plate sensing system 302 in the third phase of the four phase process, where the arrow in the spinning Hall plate sensing system 302 is directed to the right. One input of first demodulator 304 is electrically coupled to the top of spinning Hall plate sensing system 302 via first input path 314 and another input of first demodulator 304 is electrically coupled to the reference via second input path 316. First demodulator 304 is electrically coupled to input stage 306 via first input stage path 318 and second input stage path 320.

First demodulator 304 receives input signal VHin from the top of spinning Hall plate sensing system 302, where input signal VHin includes the Hall plate signal VHsignal minus the Hall plate offset voltage VHoffset. First demodulator 304 crosses the input signals to provide the input signal at 314 to second input stage path 320 and to provide the input signal at 316 to first input stage path 318. Input stage 306 receives input signal VHin and subtracts amplifier offset voltage VAoffset to obtain input signal Vin, where input signal Vin is equal to VHsignal−VHoffset−VAoffset.

Input stage 306 receives reference voltage Vref at 322 and is electrically coupled to offset amplifier 308 via first stage output paths 324 and 326. First auto-zeroing storage capacitor 328a and second auto-zeroing storage capacitor 330a are electrically coupled to offset amplifier 308 via amplifier input path 332. First auto-zeroing storage capacitor 328b and second auto-zeroing storage capacitor 330b are electrically coupled to offset amplifier 308 via amplifier input path 334. The other sides of first auto-zeroing storage capacitors 328a and 328b are electrically coupled to the reference at 336, and the other sides of second auto-zeroing storage capacitors 330a and 330b are electrically coupled to the reference at 338.

The voltage on first auto-zeroing storage capacitors 328a and 328b obtained in the first phase and the voltage on second auto-zeroing storage capacitors 330a and 330b obtained in the second phase are combined to store VHoffset+VAoffset on first and second auto-zeroing storage capacitors 328a, 328b, 330a, and 330b. Input stage 306 receives reference voltage Vref at 322 and subtracts the stored offset voltages VHoffset and VAoffset from reference voltage Vref. Input stage 306 receives Vin, which is VHsignal−VHoffset−VAoffset and compares the received Vsignal−VHoffset−VAoffset to the built Vref−VHoffset−VAoffset, i.e., input stage 306 compares Vsignal to Vref.

Input stage 306 is electrically coupled to first decoupling capacitor 340 via first stage output path 324 and to second decoupling capacitor 342 via first stage output path 326. The other side of first decoupling capacitor 340 is electrically coupled to output stage 310 via output stage input path 344 and the other side of second decoupling capacitor 342 is electrically coupled to output stage 310 via output stage input path 346.

Input stage 306 provides the comparison result, which is received by output stage 310 via first and second decoupling capacitors 340 and 342. Output stage 310 is electrically coupled to second demodulator 312 via output stage output paths 348 and 350. Second demodulator 312 receives valid output signals from output stage 310 and crosses the signals to provide the signal at 348 at output 354 and the signal at 350 at output 352.

First chopped auto-zeroing comparator 300 auto-zeroes during the first phase and the second phase and provides fast and continuous, valid output signals during the third and fourth phases.

FIGS. 6A-6D are diagrams illustrating one embodiment of a second chopped auto-zeroing comparator 400 coupled to the same spinning Hall plate sensing system 302. Second chopped auto-zeroing comparator 400 auto-zeroes during the third phase and the fourth phase and provides fast and continuous, valid output signals during the first and second phases of the four phase process.

Figure 6A:
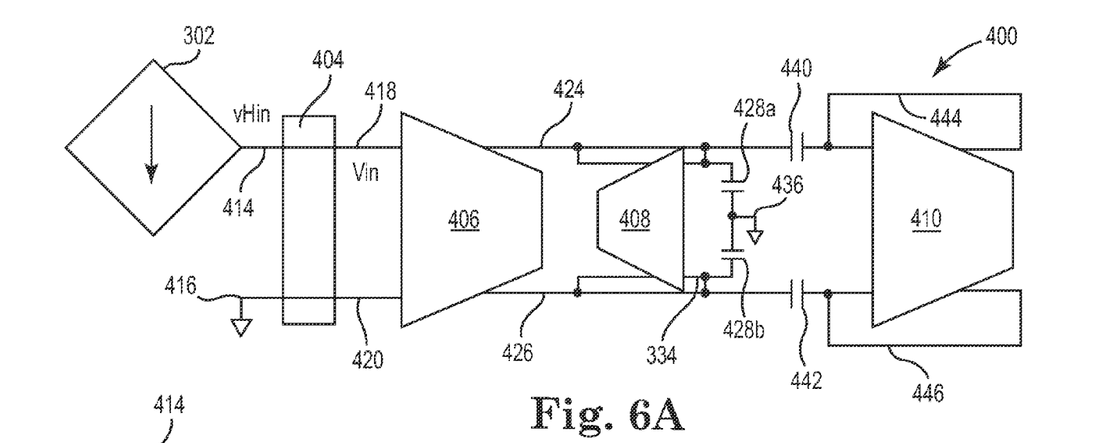
FIG. 6A is a diagram illustrating a second chopped auto-zeroing comparator and spinning Hall plate sensing system in the fourth phase of the four phase process.

FIG. 6A is a diagram illustrating second chopped auto-zeroing comparator 400 and spinning Hall plate sensing system 302 in the fourth phase of the four phase process, where the arrow in the spinning Hall plate sensing system 302 is directed downward. One input of first demodulator 404 is electrically coupled to the right side of spinning Hall plate sensing system 302 via first input path 414 and the other input of first demodulator 404 is electrically coupled to a reference, such as ground, via second input path 416. First demodulator 404 is electrically coupled to input stage 406 via first input stage path 418 and second input stage path 420.

Input stage 406 is electrically coupled to offset amplifier 408 via first stage output paths 424 and 426. Input stage 406 is electrically coupled to an output and an input of offset amplifier 408 and to one side of first auto-zeroing storage capacitor 428a via first stage output path 424. Input stage 406 is electrically coupled to another output and another input of offset amplifier 408 and to one side of first auto-zeroing storage capacitor 428b via first stage output path 426. The other sides of first auto-zeroing storage capacitors 428a and 428b are electrically coupled to a reference, such as ground, at 436.

First demodulator 404 receives input signal VHin from the right side of spinning Hall plate sensing system 302, where input signal VHin includes the Hall plate signal VHsignal plus the Hall plate offset voltage VHoffset. Input stage 406 receives input signal VHin and adds amplifier offset voltage VAoffset to obtain input signal Vin, where input signal Vin is equal to VHsignal+VHoffset+VAoffset. Offset amplifier 408 stores Vin, which is VHsignal+VHoffset+VAoffset, on first auto-zeroing capacitors 428a and 428b.

Input stage 406 is electrically coupled to first decoupling capacitor 440 via first stage output path 424 and to second decoupling capacitor 442 via first stage output path 426. The other side of first decoupling capacitor 440 is electrically coupled to output stage 410 via output stage input path 444 and the other side of second decoupling capacitor 442 is electrically coupled to output stage 410 via output stage input path 446.

The outputs of output stage 410 are electrically coupled back to the inputs of output stage 410 via output stage paths 444 and 446.

Figure 6B:
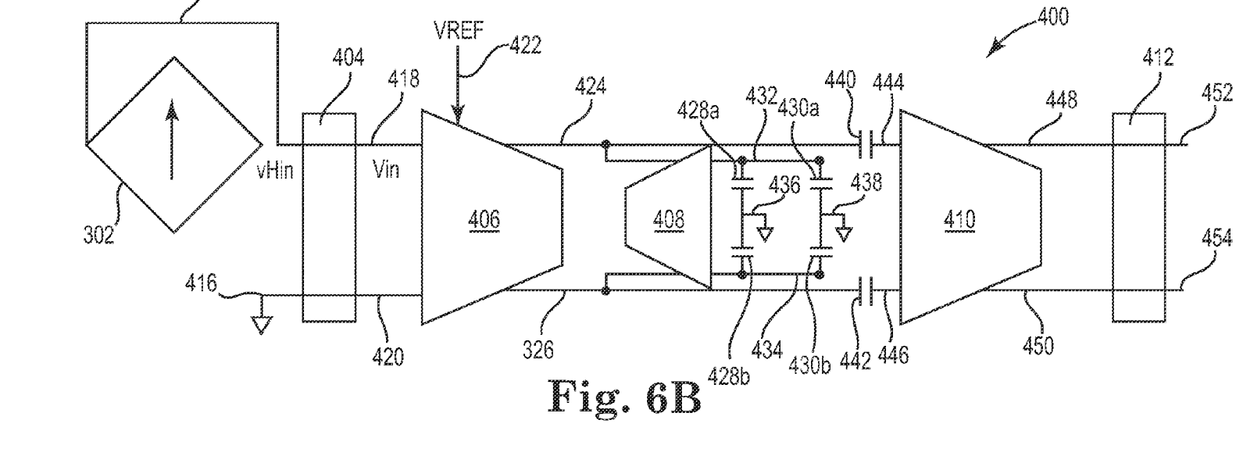
FIG. 6B is a diagram illustrating the second chopped auto-zeroing comparator and spinning Hall plate sensing system in the first phase of the four phase process.

FIG. 6B is a diagram illustrating second chopped auto-zeroing comparator 400 and spinning Hall plate sensing system 302 in the first phase of the four phase process, where the arrow in the spinning Hall plate sensing system 302 is directed upward. One input of first demodulator 404 is electrically coupled to the left side of spinning Hall plate sensing system 302 via first input path 414 and another input of first demodulator 404 is electrically coupled to the reference via second input path 416. First demodulator 404 is electrically coupled to input stage 406 via first input stage path 418 and second input stage path 420.

First demodulator 404 receives input signal VHin from the left side of spinning Hall plate sensing system 302, where input signal VHin includes the Hall plate signal VHsignal plus the Hall plate offset voltage VHoffset. Input stage 406 receives input signal VHin and adds amplifier offset voltage VAoffset to obtain input signal Vin, where input signal Vin is equal to VHsignal+VHoffset+VAoffset.

Input stage 406 receives reference voltage Vref at 422 and is electrically coupled to offset amplifier 408 via first stage output paths 424 and 426. First auto-zeroing storage capacitor 428a and second auto-zeroing storage capacitor 430a are electrically coupled to offset amplifier 408 via amplifier input path 432. First auto-zeroing storage capacitor 428b and second auto-zeroing storage capacitor 430b are electrically coupled to offset amplifier 408 via amplifier input path 434. The other sides of first auto-zeroing storage capacitors 428a and 428b are electrically coupled to the reference at 436, and the other sides of second auto-zeroing storage capacitors 430a and 430b are electrically coupled to the reference at 438.

The voltages on first auto-zeroing storage capacitors 428a and 428b and second auto-zeroing storage capacitors 430a and 430b, from the third and fourth phases, are combined to store VHoffset+VAoffset on first and second auto-zeroing storage capacitors 428a, 428b, 430a, and 430b. Input stage 406 receives reference voltage Vref at 422 and adds the stored offset voltages VHoffset+VAoffset to reference voltage Vref. Input stage 406 receives Vin, which is Vsignal+VHoffset+VAoffset, and compares the received Vsignal+VHoffset++VAoffset to the built Vref+VHoffset+VAoffset, i.e., input stage 406 compares Vsignal to Vref.

Input stage 406 is electrically coupled to first decoupling capacitor 440 via first stage output path 424 and to second decoupling capacitor 442 via first stage output path 426. The other side of first decoupling capacitor 440 is electrically coupled to output stage 410 via output stage input path 444 and the other side of second decoupling capacitor 442 is electrically coupled to output stage 410 via output stage input path 446.

Input stage 406 provides the comparison result, which is received by output stage 410 via first and second decoupling capacitors 440 and 442. Output stage 410 is electrically coupled to second demodulator 412 via output stage output paths 448 and 450. Second demodulator 412 receives valid comparison results from output stage 410 and second demodulator 412 provides the comparison results at outputs 452 and 454.

Figure 6C:
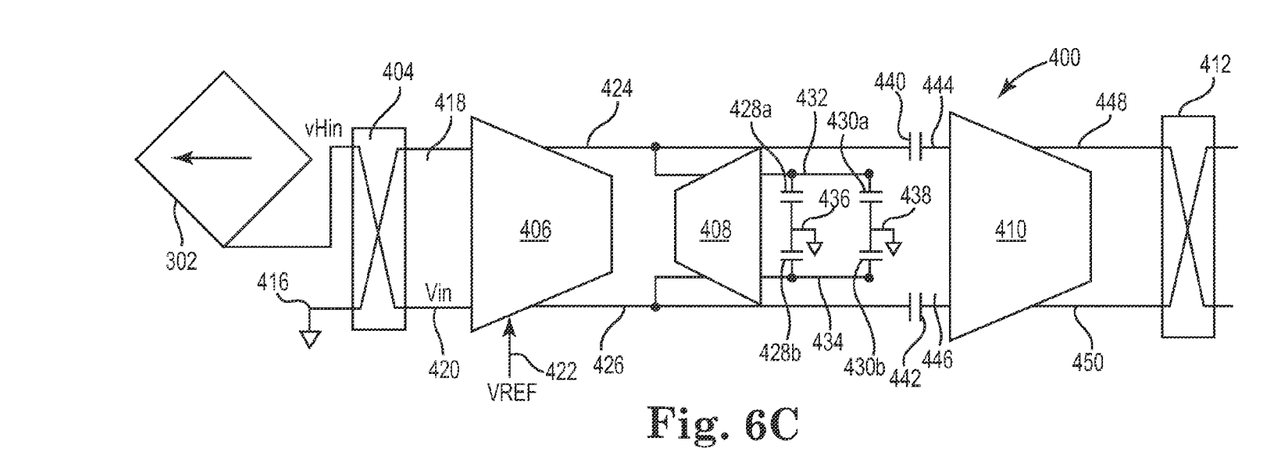
FIG. 6C is a diagram illustrating the second chopped auto-zeroing comparator and spinning Hall plate sensing system in the second phase of the four phase process.

FIG. 6C is a diagram illustrating second chopped auto-zeroing comparator 400 and spinning Hall plate sensing system 302 in the second phase of the four phase process, where the arrow in the spinning Hall plate sensing system 302 is directed to the left. One input of first demodulator 404 is electrically coupled to the bottom of spinning Hall plate sensing system 302 via first input path 414 and another input of first demodulator 404 is electrically coupled to the reference via second input path 416. First demodulator 404 is electrically coupled to input stage 406 via first input stage path 418 and second input stage path 420.

First demodulator 404 receives input signal VHin from the bottom of spinning Hall plate sensing system 302, where input signal VHin includes the Hall plate signal VHsignal minus the Hall plate offset voltage VHoffset. First demodulator 404 crosses the input signals to provide the input signal at 414 to second input stage path 420 and to provide the input signal at 416 to first input stage path 418. Input stage 406 receives input signal VHin and subtracts amplifier offset voltage VAoffset to obtain input signal Vin, where input signal Vin is equal to VHsignal−VHoffset−VAoffset.

Input stage 406 receives reference voltage Vref at 422 and is electrically coupled to offset amplifier 408 via first stage output paths 424 and 426. First auto-zeroing storage capacitor 428a and second auto-zeroing storage capacitor 430a are electrically coupled to offset amplifier 408 via amplifier input path 432. First auto-zeroing storage capacitor 428b and second auto-zeroing storage capacitor 430b are electrically coupled to offset amplifier 408 via amplifier input path 434. The other sides of first auto-zeroing storage capacitors 428a and 428b are electrically coupled to the reference at 436, and the other sides of second auto-zeroing storage capacitors 430a and 430b are electrically coupled to the reference at 438.

The voltage on first auto-zeroing storage capacitors 428a and 428b obtained in the fourth phase and the voltage on second auto-zeroing storage capacitors 430a and 430b obtained in the fourth phase are combined to store VHoffset+VAoffset on first and second auto-zeroing storage capacitors 428a, 428b, 430a, and 430b. Input stage 406 receives reference voltage Vref at 422 and subtracts the stored offset voltages VHoffset and VAoffset from reference voltage Vref. Input stage 406 receives Vin, which is VHsignal−VHoffset−VAoffset and compares the received VHsignal−VHoffset−VAoffset to the built Vref−VHoffset−VAoffset, i.e., input stage 406 compares Vsignal to Vref.

Input stage 406 is electrically coupled to first decoupling capacitor 440 via first stage output path 424 and to second decoupling capacitor 442 via first stage output path 426. The other side of first decoupling capacitor 440 is electrically coupled to output stage 410 via output stage input path 444 and the other side of second decoupling capacitor 442 is electrically coupled to output stage 410 via output stage input path 446.

Input stage 406 provides the comparison result, which is received by output stage 410 via first and second decoupling capacitors 440 and 442. Output stage 410 is electrically coupled to second demodulator 412 via output stage output paths 448 and 450. Second demodulator 412 receives valid output signals from output stage 410 and crosses the signals to provide the signal at 448 at output 454 and the signal at 450 at output 452.

Figure 6D:
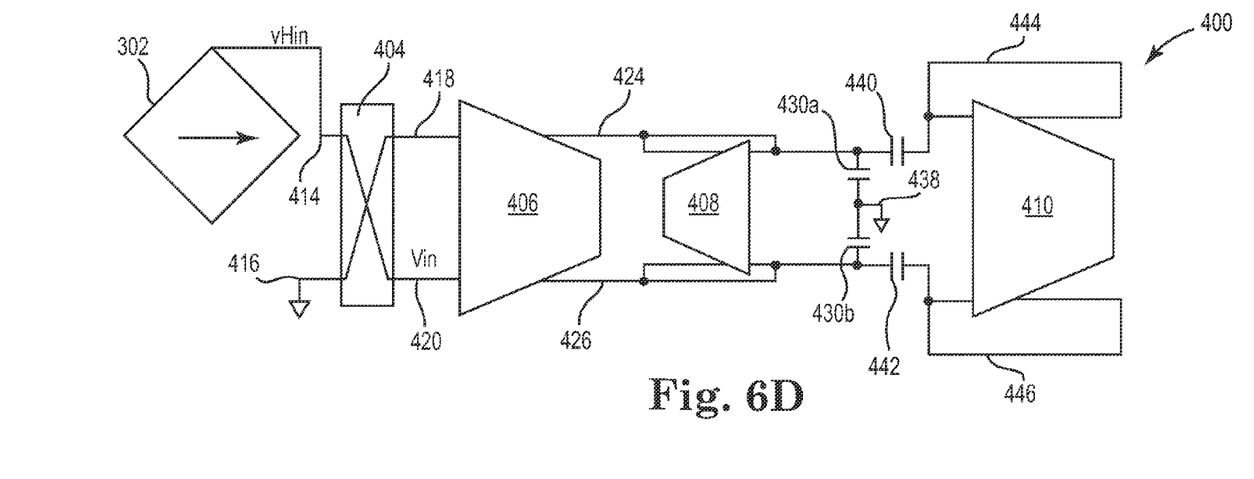
FIG. 6D is a diagram illustrating the second chopped auto-zeroing comparator and spinning Hall plate sensing system in the third phase of the four phase process.

FIG. 6D is a diagram illustrating second chopped auto-zeroing comparator 400 and spinning Hall plate sensing system 302 in the third phase of the four phase process, where the arrow in the spinning Hall plate sensing system 302 is directed towards the right. One input of first demodulator 404 is electrically coupled to the top of spinning Hall plate sensing system 302 via first input path 414 and the other input of first demodulator 404 is electrically coupled to the reference via second input path 416. First demodulator 404 is electrically coupled to input stage 406 via first input stage path 418 and second input stage path 420.

Input stage 406 is electrically coupled to offset amplifier 408 via first stage output paths 424 and 426. Input stage 406 is electrically coupled to an output and an input of offset amplifier 408 and to one side of second auto-zeroing storage capacitor 430a via first stage output path 424. Input stage 406 is electrically coupled to another output and another input of offset amplifier 408 and to one side of second auto-zeroing storage capacitor 430b via first stage output path 426. The other sides of second auto-zeroing storage capacitors 430a and 430b are electrically coupled to the reference at 438.

First demodulator 404 receives input signal VHin from the top of spinning Hall plate sensing system 302, where input signal VHin includes the Hall plate signal VHsignal minus the Hall plate offset voltage VHoffset. First demodulator 404 crosses the input signals to provide the input signal at 414 to second input stage path 420 and to provide the input signal at 416 to first input stage path 418. Input stage 406 receives input signal VHin and subtracts amplifier offset voltage VAoffset to obtain input signal Vin, where input signal Vin is equal to VHsignal−VHoffset−VAoffset. Offset amplifier 408 stores—VHsignal+VHoffset+VAoffset on second auto-zeroing capacitors 430a and 430b.

Input stage 406 is electrically coupled to first decoupling capacitor 440 via first stage output path 424 and to second decoupling capacitor 442 via first stage output path 426. The other side of first decoupling capacitor 440 is electrically coupled to output stage 410 via output stage input path 444 and the other side of second decoupling capacitor 442 is electrically coupled to output stage 410 via output stage input path 446.

The outputs of output stage 410 are electrically coupled back to the inputs of output stage 410 via output stage input paths 444 and 446.

Second chopped auto-zeroing comparator 400 provides fast and continuous, valid output signals during the first phase and the second phase and auto-zeroes during the third and fourth phases.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system, comprising:
   a sensing system configured to provide sensed input signals;
   a first chopped circuit configured to provide a switched output signal that switches in response to values of the sensed input signals crossing a limit;
   a second chopped circuit configured to provide a high resolution output signal that corresponds to the sensed input signals and has a higher resolution than the switched output signal; and
   a clock generator configured to provide clock signals that synchronize chopping of the first chopped circuit and the second chopped circuit.

2. The system of claim 1, wherein the first chopped circuit includes a chopped auto-zeroing comparator.

3. The system of claim 2, wherein the chopped auto-zeroing comparator is chopped and auto-zeroed at the same frequency via the clock generator.

4. The system of claim 1, wherein the first chopped circuit comprises at least two chopped auto-zeroing comparators and at least one of the at least two auto-zeroing comparators provides a valid switched output signal during each chopping phase.

5. The system of claim 1, wherein the first chopped circuit provides the switched output signal faster than the second chopped circuit provides the high resolution output signal.

6. The system of claim 1, wherein the second chopped circuit includes one of a chopped sigma delta analog to digital converter, a chopped analog comparator, a chopped auto-zeroed analog comparator, and a chopped analog amplifier.

7. The system of claim 1, comprising:
   a programmable digital to analog converter configured to provide the limit, wherein the limit is one of a constant limit and a slope limit.

8. The system of claim 1, comprising:
   a bias circuit configured to provide temperature and technology spread compensation to the first chopped circuit and the second chopped circuit.

9. An integrated circuit, comprising:
   a magnetic sensing system configured to provide sensed input signals;
   a chopped auto-zeroing comparator configured to receive the sensed input signals and switch a switched output signal in response to values of the sensed input signals crossing a limit;
   a circuit configured to receive the sensed input signals and provide a high resolution output signal that corresponds to the sensed input signals and has a higher resolution than the switched output signal; and
   a clock generator system configured to provide clock signals that synchronize the magnetic sensing system and chopping of the chopped auto-zeroing comparator and auto-zeroing of the chopped auto-zeroing comparator.

10. The integrated circuit of claim 9, wherein the clock generator system zeroes the auto-zeroing comparator and chops the chopped auto-zeroing comparator at the same frequency.

11. The integrated circuit of claim 9, wherein the magnetic sensing system comprises:
    a spinning hall plate sensing system, and the clock generator system spins the spinning hall plate sensing system and chops the chopped auto-zeroing comparator at the same clocking frequency.

12. The integrated circuit of claim 9, wherein the magnetic sensing system is configured to sense a current in a conductor and maintain galvanic isolation between the chopped auto-zeroing comparator and the conductor and between the circuit and the conductor.

13. The integrated circuit of claim 9, wherein the circuit includes at least one of an auto-zeroed analog comparator, an analog amplifier, and an auto-zeroed analog to digital converter.

14. A method, comprising:
    providing sensed input signals;
    outputting a switched output signal via a first chopped circuit, wherein the switched output signal switches in response to values of the sensed input signals crossing a limit;
    outputting a high resolution output signal via a second chopped circuit, wherein the high resolution output signal corresponds to the sensed input signals and has a higher resolution than the switched output signal; and
    synchronizing clocking of the first chopped circuit and the second chopped circuit.

15. The method of claim 14, wherein the first chopped circuit is an auto-zeroing comparator and comprising:
    chopping the auto-zeroing comparator and auto-zeroing the auto-zeroing comparator at the same frequency.

16. The method of claim 14, comprising:
    outputting at least one more switched output signal that switches in response to values of the sensed input signals crossing a limit, wherein at least one of the switched output signal and the at least one more switched output signal is valid during each chopping phase.

17. The method of claim 14, comprising:
    outputting the switched output signal faster than outputting the high resolution output signal.

18. The method of claim 14, wherein the second chopped circuit is one of a chopped sigma delta analog to digital converter, a chopped analog comparator, a chopped auto-zeroed analog comparator, and a chopped analog amplifier.

19. The method of claim 14, comprising:

providing temperature and technology spread compensation to the first chopped circuit and the second chopped circuit via a bias circuit.

20. A method, comprising:

sensing a current magnetically to provide sensed input signals;

receiving the sensed input signals at a chopped auto-zeroing comparator;

switching a switched output signal from the auto-zeroing comparator in response to values of the sensed input signals crossing a limit that is one of a constant limit and a slope limit;

receiving the sensed input signals at a circuit;

outputting a high resolution output signal from the circuit, which corresponds to the sensed input signals and has a higher resolution than the switched output signal; and synchronizing the sensing of the current magnetically, chopping of the chopped auto-zeroing comparator, and auto-zeroing of the chopped auto-zeroing comparator.

21. The method of claim 20, comprising:

auto-zeroing the auto-zeroing comparator and chopping the chopped auto-zeroing comparator at the same frequency.

22. The method of claim 20, comprising:

spinning a hall plate sensing system and chopping the chopped auto-zeroing comparator at the same frequency.

* * * * *